United States Patent
Kim et al.

(10) Patent No.: US 10,672,698 B2
(45) Date of Patent: Jun. 2, 2020

(54) CHIP ON FILM INCLUDING SIGNAL LINES FOR MULTIPLE SIGNAL PATHS AND A DISPLAY DEVICE HAVING THEREOF

(71) Applicant: LG Display Co., Ltd., Seoul (KR)

(72) Inventors: Daekyung Kim, Ulsan (KR); Wansik Lim, Paju-si (KR); Jaesung Jeon, Seoul (KR); Ri Yu, Seoul (KR); Cheolho Lee, Busan (KR); Joohye Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/215,331

(22) Filed: Dec. 10, 2018

(65) Prior Publication Data

US 2019/0198438 A1    Jun. 27, 2019

(30) Foreign Application Priority Data

Dec. 27, 2017    (KR) ........................ 10-2017-0180759

(51) Int. Cl.
| | |
|---|---|
| *H01L 23/498* | (2006.01) |
| *H01L 23/31* | (2006.01) |
| *H01L 23/00* | (2006.01) |
| *G02F 1/1345* | (2006.01) |
| *H05K 1/00* | (2006.01) |
| *H05K 1/14* | (2006.01) |

(52) U.S. Cl.
CPC ...... *H01L 23/49838* (2013.01); *G02F 1/1345* (2013.01); *H01L 23/3185* (2013.01); *H01L 23/4985* (2013.01); *H01L 23/49827* (2013.01); *H01L 24/16* (2013.01); *H05K 1/00* (2013.01); *H05K 1/147* (2013.01); *G02F 1/13452* (2013.01); *H01L 23/3121* (2013.01); *H01L 2224/16227* (2013.01); *H01L 2924/1426* (2013.01)

(58) Field of Classification Search
CPC ............. G02F 1/13452; G02F 1/13454; H01L 23/49827; H01L 23/49833; H01L 2924/1426
See application file for complete search history.

(56) References Cited

U.S. PATENT DOCUMENTS

2014/0264907 A1*  9/2014  Altunyurt ........... H01L 23/5226
                                                                 257/774

* cited by examiner

*Primary Examiner* — Hoai V Pham
(74) *Attorney, Agent, or Firm* — Fenwick & West LLP (57) ABSTRACT

A chip on film according to the present disclosure includes a base film, a plurality of signal wirings on an upper surface and a lower surface of the base film to transmit a signal in two signal paths, a driving unit on one surface of the upper surface and the lower surface of the base film, a first pad and a second pad on one surface of the upper surface and the lower surface of the base film, and a plurality of through holes between the first pad and the second pad and electrically connect to the signal wiring.

11 Claims, 6 Drawing Sheets

CHIP ON FILM INCLUDING SIGNAL LINES FOR MULTIPLE SIGNAL PATHS AND A DISPLAY DEVICE HAVING THEREOF

CROSS-REFERENCE TO RELATED APPLICATION

This application claims priority to Republic of Korea Patent Application No. 10-2017-0180759, filed on Dec. 27, 2017 with the Korean Intellectual Property office, which is incorporated herein by reference in its entirety.

BACKGROUND

Field of Technology

The present disclosure relates to a chip on film (COF) capable of reducing a region and a display device having the same.

Description of the Related Art

As an age of full-scale information has become, a field of a display device for visually displaying an electrical information signal is rapidly developing. Accordingly, various display devices have been developed and commercialized. For example, various display devices such as a liquid crystal display, an organic light emitting display, an electro phoretic display, and a quantum dot display have been used and are being applied not only to small home appliances such as cell phones and tablet TVs but also to large area TVs.

The display device includes a display panel including a plurality of pixels defined by a plurality of gate lines and data lines, a switching element and a display element arranged in each pixel, a gate driving unit which applies a scanning signal through the plurality of gate lines to drive the switching element, a data driving unit which supplies an image signal through the switching element through the plurality of data lines, a timing controlling unit which supplies various control signals to the gate driving unit and the data driving unit, and a gamma voltage generating unit which generates a reference gamma voltage and supplies it to the data driving unit.

The gate driving unit may be directly mounted on a non-display region of the display panel to reduce the volume and manufacturing cost of the display device. The plurality of data driving units may be mainly mounted on a chip on film (COF), and is attached to the display panel to supply an image signal.

However, the following problem arises in a flat panel display device having the COF as described above. The number of gate lines and data lines formed on the display panel has been greatly increased as the size of the display device becomes larger and becomes higher in resolution. On the other hand, since the area of the COF mounted with the data driving unit for supplying the video signal to the data line is limited, there is a limitation in forming a signal wiring corresponding to a large number of data lines in the COF one-to-one.

SUMMARY

The inventors of the present disclosure have recognized the problem of increasing the area of a COF to be applied to a high resolution display device, and accordingly, increasing the length of a bezel of the display device, and have studied new method for forming a signal wiring in the COF.

A problem to be solved by the present disclosure is to provide a COF in which a signal wiring is arranged on the upper and lower surfaces of a base film to transmit a signal in two paths.

Another problem to be solved by the present disclosure is to provide a COF which provides a through hole between a first pad and a second pad, and reduces a tolerance region of a protective layer to reduce a length.

Still another problem to be solved by the present disclosure is to provide a display device including the above mentioned COF.

In order to solve the above-mentioned problems, a chip on film according to an embodiment of the present disclosure includes a base film, a plurality of signal wirings on an upper surface and a lower surface of the base film to transmit a signal in two signal paths, a driving unit on one surface of the upper surface and the lower surface of the base film, a first pad and a second pad on one surface of the upper surface and the lower surface of the base film, and a plurality of through holes between the first pad and the second pad to electrically connect the signal wiring. Therefore, a COF applicable to a high resolution display device can be formed.

The display device according to another embodiment of the present disclosure includes a display panel including a display region and a pad region outside the display region; and a chip on film attached to the pad region. Therefore, the high resolution display device can be realized.

DETAILED DESCRIPTION

The advantages and features of the present disclosure and the manner of achieving them will become apparent with reference to the embodiments described in detail below together with the accompanying drawings. The present disclosure may, however, be embodied in many different forms and should not be construed as being limited to the embodiments disclosed below. Rather, these embodiments are provided so that this disclosure of the disclosure will be thorough and complete, and will fully convey the scope of the disclosure to those skilled in the art, and the present disclosure is defined by the scope of claims.

The shapes, sizes, ratios, angles, numbers, and the like described in the drawings for describing the embodiments of the present disclosure are merely exemplary, and the present disclosure is not limited the shown matter. Like reference numerals refer to like elements throughout the specification. In addition, in describing the present disclosure, when it is considered that a detailed description with regard to the known related arts may obscure the gist of the present disclosure, the detailed description thereof will be omitted. When 'include', 'has', and 'comprises', etc. mentioned in the present specification are used, other parts can be added unless '~only' is used. When the component is expressed as a singular, it includes the case including a plural unless otherwise particularly explicitly described.

In interpreting the component, it is interpreted to include an error range even if there is no separate explicit description.

In the case of a description of a positional relationship, for example, if the positional relationship between two parts is described as 'on~', 'in an upper part~', 'in a lower part~', or 'next to~', unless 'immediately' or 'directly' are used, one or more other parts may be disposed between two parts.

In the case of a description of a temporal relationship, for example, if a temporal order relationship is described as 'after~', 'following~', 'next~', or 'before~', unless 'immediately' or 'directly' are not used, it may include the case which is not continuous.

The first, second, etc. are used to describe various components, but these components are not limited by these terms. These terms are only used to distinguish only one component from another. Therefore, the first component mentioned below may be the second component within the technical spirit of the present disclosure.

Each of the features of the various embodiments of the present disclosure can be coupled or combined with each other, partially or entirely, and technically various interlocking and driving are possible, and the embodiments may be performed independently of each other, and can be performed in an associative relation.

Hereinafter, the present disclosure will be described in detail with reference to the accompanying drawings.

Figure 1:
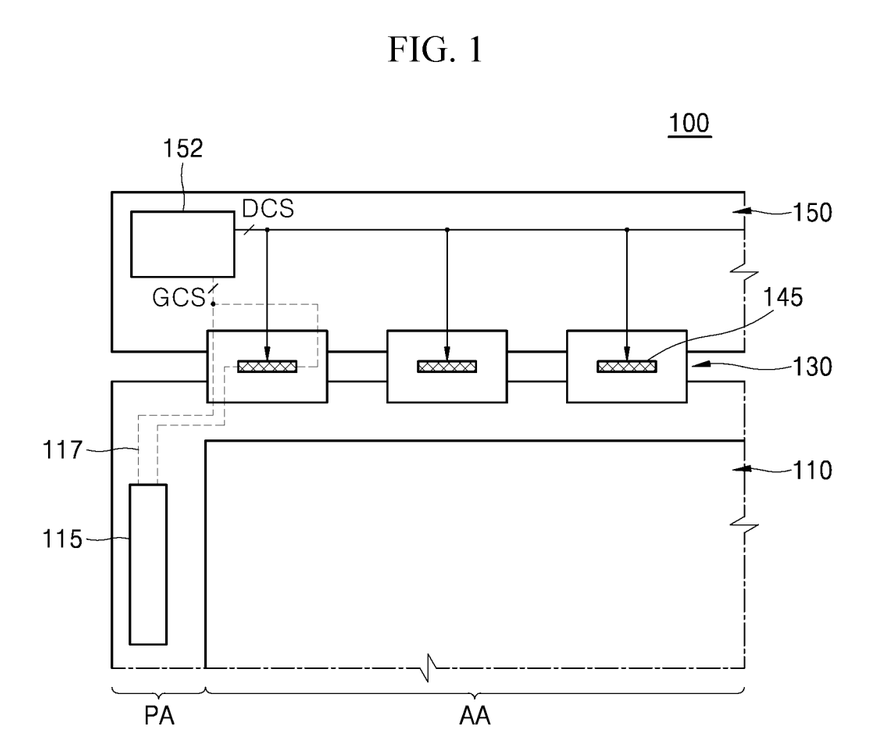
FIG. 1 is a partial plan view of a display device to which a COF is attached in accordance with a first embodiment of the present disclosure.
Figure 2:
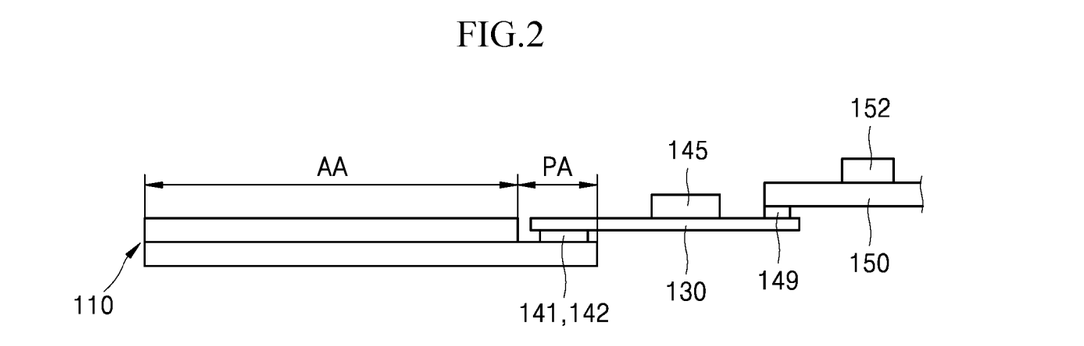
FIG. 2 is a partial cross-sectional view of a first embodiment of the present disclosure.

FIG. 1 is a partial plan view showing a display device to which the COF is attached in accordance with an exemplary embodiment of the present disclosure, and FIG. 2 is a partial cross-sectional view.

As shown in FIGS. 1 and 2, a display device 100 according to the present disclosure includes a display panel 110 on which an actual image is realized, a COF 130 having one side attached to a pad region of the display panel 110, and a printed circuit board (PCB) 150 to which the other side of the COF 130 is attached.

Various flat panel display panels can be applied to the display panel 110. For example, in the present disclosure, various flat panel display panels such as a liquid crystal display panel, an organic light emitting display panel, an electro phoretic display panel, and a quantum dot display panel may be applied as the display panel 110.

In the display region AA of the display panel 110, a plurality of gate lines and data lines are arranged, and a plurality of pixels are defined. A switching element and a display element are provided in each pixel. In this case, the switching element may be a thin film transistor, and the display element may be a liquid crystal layer, an organic light emitting layer, an electro phoresis layer, or a quantum dot element, but is not limited thereto.

A gate driving unit 115 is mounted on the left pad region (PA) of the display panel 110. The gate driving unit 115 generates a scan signal as a gate control signal from the outside is input and supplies it to the gate line of the display region AA. In this case, the gate driving unit 115 may be manufactured in a form of a semiconductor IC chip and mounted on the pad region (PA) of the display panel 110 (Chip On Glass), and it may have a gate in panel (GIP) structure that various elements such as the thin film transistor are formed in the pad region (PA).

The COF 130 is attached to the upper pad region (PA) of the display panel 110 and is mounted on the data driving unit 145 and supplies an image data to the data line of the display region AA according to a data control signal input from outside. Although not shown in the drawings, a pad is formed in the COF 130, and is electrically connected to the pad of the display panel 110 and the pad of the PCB 150. In addition, a signal wiring is formed on the upper surface and the lower surface of the COF 130 to supply a signal applied from the PCB 150 to the data driving unit 145 and supply a signal generated from the data driving unit 145 to the data line of the display panel 110.

The PCB 150 is provided with a timing controlling unit 152. The timing controlling unit 152 aligns an image signal input from the outside in correspondence with a size and a resolution of the display panel 110 and supplies it to a plurality of data driving units 145 mounted on each of the plurality of COFs 130. In addition, the timing controlling unit 152 generates a plurality of gate control signals GCS and data control signals DCS by using a synchronization signal such as a dot clock, a data enable signal, a horizontal synchronization signal, and a vertical synchronization signal input from the outside and supplies it to the gate driving unit 115 and the data driving unit 145.

The PCB 150 may be configured in various forms. For example, the PCB 150 may have a configuration that at least layer of a copper foil is laminated on one surface or both surfaces of a base substrate consisting of epoxy resin, and at least one layer of copper foil is laminated on one surface or both surfaces of a plastic film having a flexibility. In addition, it may be formed in a multilayer structure in which the copper foil is formed inside the base substrate.

A separate signal wiring that does not pass through the data driving unit 145 is formed in any of the COFs 130 of the COFs 130 attached to the upper pad region (PA) of the display panel 110, and an auxiliary wiring 117 connected to the separate signal wiring is formed in the region PA of the display panel 110 so that a signal output from the timing controlling unit 152 can be directly supplied to gate driving unit 115 through the signal wiring of the COF 130 and the auxiliary wiring 117 of the display panel. In this case, the auxiliary wiring 117 is a wiring formed directly on the substrate of the display panel 110, and may be referred to as a line on glass (LOG).

The COF 130 is connected to the display panel 110 through the pads 141 and 142 formed on the lower surface of the COF 130 and connected to the PCB 150 via a pad 149 formed on the upper surface of the COF 130. The pads 141 and 142 formed on the lower surface of the COF 130 and the pad 149 formed on the upper surface thereof are each provided with a conductive attachment member such as an anisotropic conductive film to electrically connect the pad of the display panel 110 and the pad of the PCB 150. Detailed description thereof will be described in detail through FIG. 3.

Figure 3:
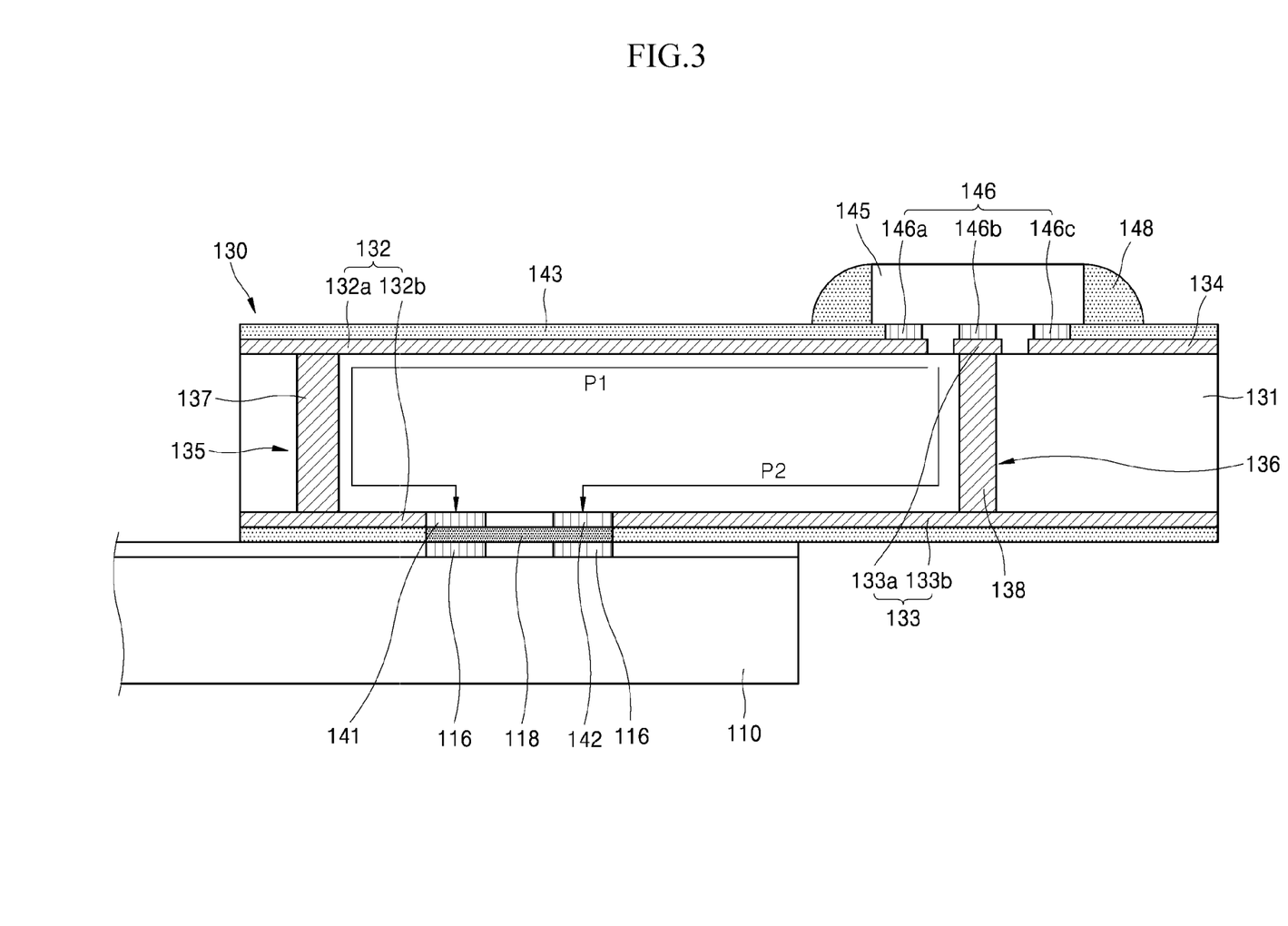
FIG. 3 is a cross-sectional view of a COF in accordance with a first embodiment of the present disclosure.

FIG. 3 is a view showing a structure of the COF 130 and an attachment structure with the display panel 110 in accordance with the first embodiment of the present disclosure.

As shown in FIG. 3, the COF 130 according to the first embodiment of the present disclosure includes a base film 131, the signal wirings 132, 133, 134 formed on the upper surface and the lower surface of the base film 131, a first through hole 135 and a second through hole 136 formed in the base film 1331 and connecting the upper surface and the lower surface of the base film 131, a first connection wiring 137 and a second connection wiring 138 electrically connecting the signal wirings 132, 133 formed in the upper surface and the lower surface of the base film 131 through the first and second through holes 135 and 136, and a first pad 141 and a second pad 142 formed on the lower surface of the COF 130 and electrically connecting with the signal wiring.

The COF 130 has a structure in which one side of the lower surface of the COF 130 is attached to a pad region of the display panel 110, a data driving unit 145 is mounted on an upper surface thereof, and the first pad 141 and the second pad 142 electrically connecting with the display panel 110 are formed on the lower surface thereof.

The base film 131 is made of a flexible plastic material such as polyimide or polyamide. The signal wirings 132, 133, 134 are made of a metal having good conductivity such as copper (Cu), but is not limited thereto.

The signal wirings 132, 133, 134 are composed of an input wiring 134 for inputting various signals output from the timing control unit 152 of the PCB 150 to the data driving unit 145, and a first output wiring 132 and a second output wiring 133 for outputting the signal generated from the data driving unit 145 to the display panel 110.

The input wiring 134 is formed on the upper surface of the base film 131 to electrically connect the COF 130 to the PCB.

The first output wiring 132 is composed of a first upper output wiring 132a formed on the upper surface of the base film 131 and a first lower output wiring 132b formed on the lower surface of the base film 131. The first upper output wiring 132a and the first lower output wiring 132b are electrically connected by a first connection wiring 137 formed in the first through hole 135.

The second output wiring 133 is composed of a second upper output wiring 133a formed on the upper surface of the base film 131 and a second lower output wiring 133b formed on the lower surface of the base film 131. The second upper output wiring 133a and the second lower output wiring 133b are electrically connected by a second connection wiring 138 formed in the second through hole 136.

The first pad 141 and the second pad 142 formed on the lower surface of the COF 130 are connected to the first lower output wiring 132b and the second lower output wiring 133b, respectively. The first pad 141 and the second pad 142 are connected to the pads 116 and 142 of the display panel 110 by a conductive film 118 such as an anisotropic conductive film to supply various signals output from the data driving unit 145 to the display panel 110.

The data driving unit 145 in the form of a semiconductor IC chip mounted on the upper surface of the COF 130 has a plurality of bumps 146 connected to a plurality of input terminals and output terminals. Bump 146 includes a first bump 146a, a second bump 146b, and a third bump 146c. The first bump 146a of the data driving unit 145 is connected to the first upper output wiring 132a and the first lower output wiring 132b is connected to the first pad 141, and the display panel 110 is electrically connected to the pad 116 via the first output wiring 132 for the first bump 146a of the data driving unit 145.

The second bump 146b of the data driving unit 145 is connected to the second upper output wiring 133a and the second lower output wiring 133b is connected to the second pad 142, and the display panel 110 is electrically connected to the pad 116 via the second output wiring 132 for the second bump 146b of the data driving unit 145.

The third bump 146c of the data driving unit 145 is connected to the input wiring 134 and the input wiring 134 is connected to the PCB so that the third bump 146c of the data driving unit 146 is connected to the PCB via the input wiring 134. Thus, in the present disclosure, a signal supplied from the PCB is input to the data driving unit 145 through the input wiring 134, and the signal output from the data driving unit 145 is supplied to the display panel 110 via the first output wiring 132 and the second output wiring 145. Accordingly, in the present disclosure, a signal output from the data driving unit 145 is supplied to the display panel 110 through two signal paths P1 and P2.

A protective layer 143 is provided in the upper surface and the lower surface of the base film 131 to protect a metal film forming the signal wirings 132, 133, and 134 exposed to the outside. In this case, the material of the protective layer 143 may be, but is not limited to, a photo solder resist. The protective layer 143 is formed over the upper surface and the lower surface of the COF 130, but is removed in the mounted region of the data driving unit 145 in the upper surface and in the formed region of the first pad 141 and the second pad 142 in the lower surface. The part of the signal wirings 132,133, and 134 and the first and second pads 141,142 are exposed to the outside, and the bump 146 of the data driving unit 145 is connected to the exposed signal wirings 132, 133, and 134, and the pad 116 of the display panel 110 is connected to the exposed first and second pads 141, 142.

In addition, the data driving unit 145 mounted on the upper surface of the COF 130 is sealed by a sealing material 148. In this case, the sealing material 148 may be composed of any one of acrylic, epoxy, silicone, and rubber resins or a mixture thereof.

Meanwhile, although the first pad 141 and the second pad 142 are formed on the lower surface of the COF 130 in the drawings, the first pad 141 and the second pad 142 may be formed on the upper surface of the COF 130. In addition, although the data driving unit 145 is mounted on the upper surface of the COF 130 in the drawings, the data driving unit 145 may be mounted on the lower surface of the COF 130.

Figure 4:
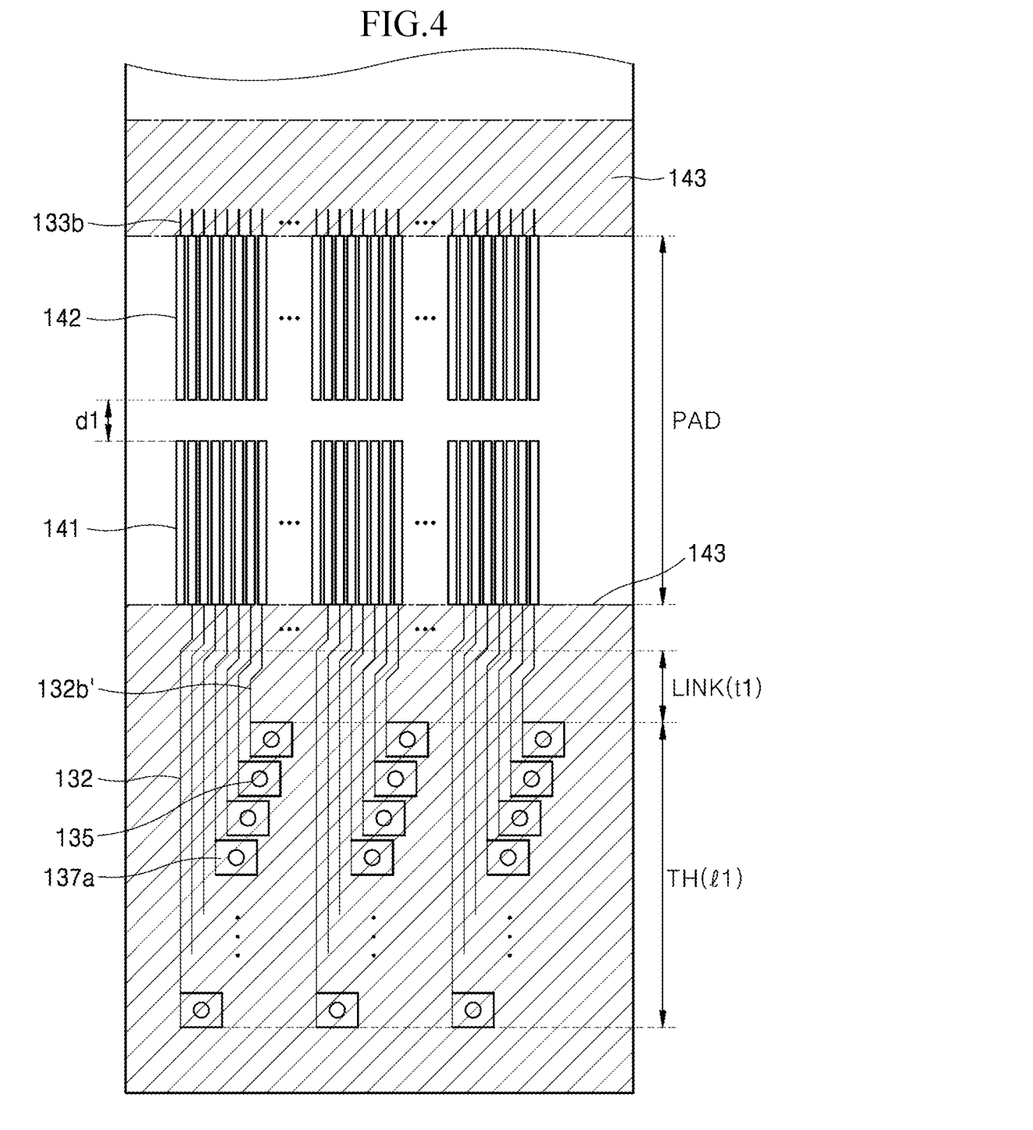
FIG. 4 is a partial rear view of a COF in accordance with a first embodiment of the present disclosure.

FIG. 4 is a partial rear view of the COF 130 in accordance with the first embodiment of the present disclosure, showing the first pad 141, the second pad 142, and the first through hole 135.

As shown in FIG. 4, the first pad 141 and the second pad 142 of the COF 130 are formed along a longitudinal direction of the COF 130 in the COF 130, respectively and a plurality of pads are arranged along a width direction. Each of the plurality of first pads 141 is connected to each of the plurality of first output wirings 132 in a one-to-one correspondence manner. Each of the plurality of second pads 142 is connected to each of the plurality of second output wirings 133 in one-to-one correspondence manner. In addition, the plurality of first output wirings 132 and second output wirings 133 are connected to the output terminal of the data driving unit 145 in one-to-one. The first pad 141 and the second pad 142 are arranged apart along the longitudinal direction of the COF 130 with a distance of d1 and the first pad 141 and the second pad 142 which are spaced apart are connected to the pad 116 of the display panel 110.

The first lower output wiring 132b is electrically connected to the first connection wiring 137 formed inside the first through hole 135. As show in the drawings, a through hole pad 137a formed extended with the first connection wiring 137 inside the COF 130 is provided around each first through hole 135 in the rear surface of the COF 130, and the through hole pad 137a is connected with the first lower output wiring 132b, and thus, the first lower output wiring 132b is connected to the first connection wiring 137. In addition, the through hole pad is formed in the upper surface of the COF 130 to be electrically connected with the upper output wiring 132a.

In this case, since the width of the through hole pad 137a is larger than the width of the first lower output wiring 132b, in the case of arranging the through hole pad 137a in a row along a width direction of the COF 130, as the first lower output wiring 132b, the adjacent through hole pads 137a are overlapped with each other, and thus, there is a problem that the first lower output wirings 132b, the first lower output wirings 132b, and the pad 116 of the display panel 110 are shorted.

In order to prevent such a shorting, when a plurality of through hole pads 137a are arranged in a line along the width direction of the COF 130 spaced with a predetermined distance, the distance between the first lower output wiring 132b connected to the through hole pad 137a is too wide, and the width of the COF 130 is increased or the number of the first lower output wiring 132b formed in the COF 130 has to be reduced. When the width of the COF 130 is increased, there may be a problem that the width of the plurality of COFs 130 attached to the display panel 110 is greater than the width of the display panel 110. The pad 116 which is not connected to the first lower output wiring 132b of each of the plurality of COFs 130 among the pad 116 of the display pane 110 may be generated. Explaining it again, no signal may be applied to some pads 116 of the display panel 110. Also, since the distance between the first lower output wirings 132b is too wide, there is a problem that it cannot be applied to a high resolution display device.

In the present disclosure, in order to solve this problem, the through hole pad1 137a is arranged such that it is spaced apart from each other by a predetermined distance along the longitudinal direction and is overlapped with each other along the width direction. In this case, the through hole region (TH) is formed to have a length of l1 and the through hole pads 137a are arranged at an oblique angle in the through hole region (TH) such that it is overlapped in the width direction and spaced apart from each other by a predetermined distance, such that adjacent through hole pads 137a do not contact with each other. Each of the through hole pads 137a is connected to the first lower output wiring 132b.

In this configuration, since the spaced distance in the width direction between the through hole pads 137a is arranged to be similar to the distance between the first lower output wirings 132b, there is no need to increase the distance between the first lower output wirings 132b, and the width of the COF 130 can be prevented from being increased but the length of the COF 130 is increased because the through hole region (TH) is formed along the longitudinal direction. However, the increase in the length of the COF 130 can be applied to a high resolution display device, since there is no problem in signal application and application of the high resolution display device.

Meanwhile, since the through hole pad 137a is arranged along a line inclined at a predetermined angle in the through hole region (TH), a part of the first lower output wiring 132b, which extends linearly, is directly connected to the through hole pad 137a, and the other part of the first lower output wiring 132b is bent at a predetermined angle to avoid the through hole pads 137a facing to each other. This bent part is a part that connects the first lower output wiring 132b and the through hole pads 137a as a link wiring 132b' of the first lower output wiring 132b. Here, a separate term, i.e., the link wiring 132b' is used, but the link wiring 132b' is a part of the first lower output wiring 132b extending from the first lower output wiring 132b. Therefore, the link wiring 132b' may be referred to as a link part of the first lower output wiring 132b.

The link wiring 132b' of the first lower output wiring 132b is arranged in the link region (LINK) of the COF 130. Since the bent positions of the plurality of first lower output wirings 132b bent are vary according to the positions, the link wiring 132b' of the plurality of first lower output wirings 132b arranged in the width direction is arranged in a length of t1 along the longitudinal direction in the COF 130.

The protective layer 143 is laminated on the lower surface of the COF 130 to cover the first lower output wiring 132b and the second lower output wiring 133b. In this case, the protective layer 143 is removed from the pad region (PAD) composed of the first pad 141, the second pad 142, and the region therebetween, the first pad 141 and the second pad 142 are exposed to the outside, and the exposed first pad 141 and second pad 142 contact with the pad 116 of the display panel 110 so that the COF 130 and the display panel 110 are electrically connected.

As described above, in the present disclosure, the first output wiring 132 and the second output wiring 133 are formed on the upper surface and the lower surface of the COF 130, a signal is applied by using two paths P1, P2 form the data driving unit 145 to the display panel 110. Therefore, compared with the COF having the structure in which the output wiring is provided on only one surface and the signal is applied, the output wiring of the COF 130 can be twice as much, so that the region of the COF 130 can be greatly reduced.

In addition, since the output wiring sensed in the same area compared to the general structure can be provided, it can be suitably applied to a high resolution display device.

Figure 5:
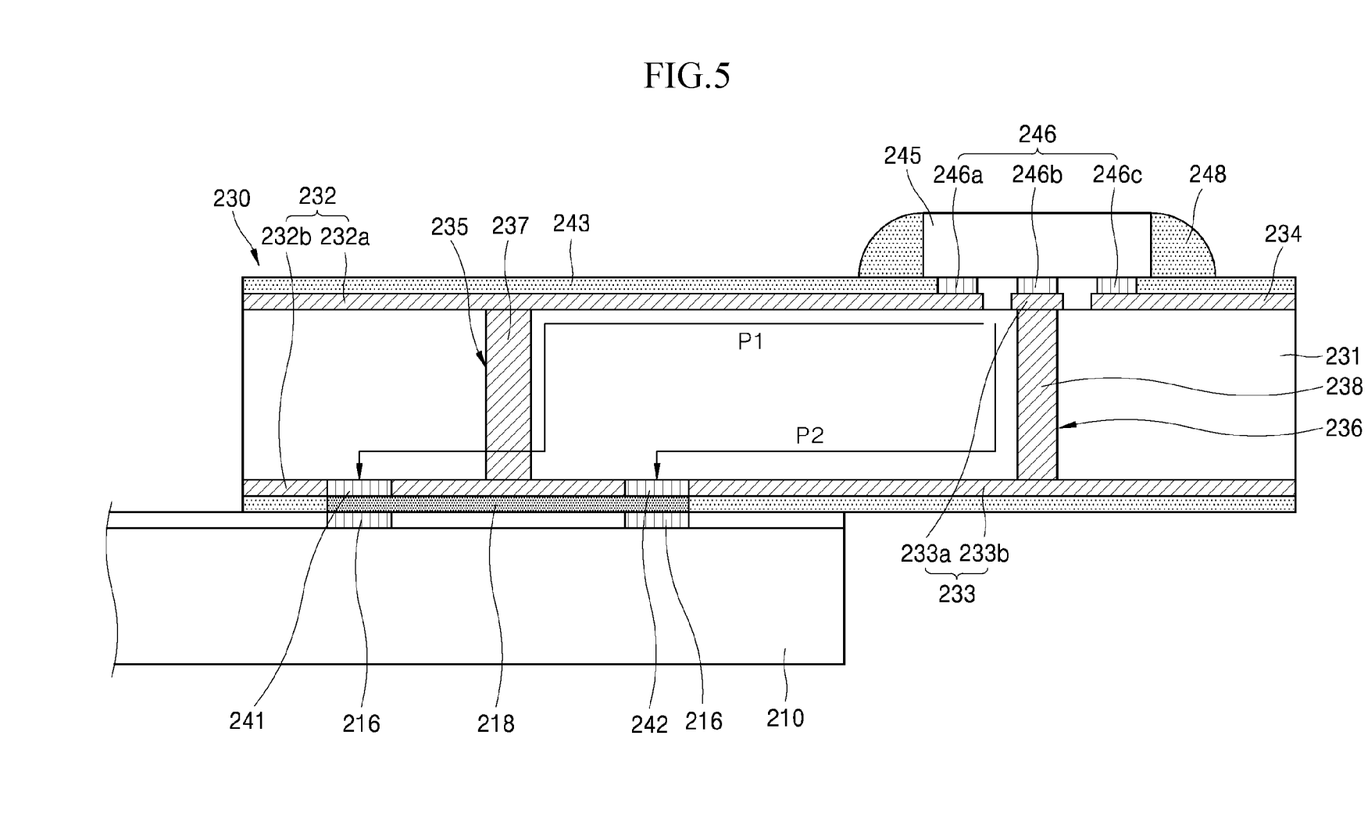
FIG. 5 is a cross-sectional view of COF in accordance with second embodiment of the present disclosure.

FIG. 5 is a cross-sectional view showing a structure of a COF 230 in accordance with the second embodiment of the present disclosure. In this case, the description of the same structure as the first embodiment of the present disclosure will be omitted or simplified, and only other structures will be described in detail.

As shown in FIG. 5, the COF 230 in accordance with the second embodiment of the present disclosure includes a base film 231, the signal wirings 232, 233, 234 formed on the upper surface and the lower surface of the base film 231, the first through hole 235 and the second through hole 236 formed on the base film 231, the first connection wiring 237 and the second connection wing 238 which are formed on the first and second through holes 235, 236, respectively and electrically connects the signal wirings 232, 233 formed on the upper surface and the lower surface of the base film 231, and the first pad 241 and the second pad 242 which are formed on the lower surface of the COF 230 and electrically connect with the signal wiring.

The signal wirings 232, 233, and 234 are composed of an input wiring 234 for inputting various signals output from the timing controlling unit of the PCB to the data driving unit 245 and a first output wiring 232 and a second output wiring 233 outputting the signal generated from the data driving unit 245 to the display panel 210.

The input wiring 234 is formed on the upper surface of the base film 231 to electrically connect the COF 230 to the PCB.

The first upper output wiring 232a and the first lower output wiring 232b of the first output wiring 232 are electrically connected by the first connection wiring 237 formed in the first through hole 235, and the second upper output wiring 233a and the second lower output wiring 233b of the second output wiring 233 are electrically connected by a second connection wiring 238 formed in the second through hole 236.

The first pad 241 connected to the first lower output wiring 232b and the second pad 242 connected to the second lower output wiring 233b are formed on the lower surface of the COF 230. In this case, the first through hole 235 is arranged in the region between the first pad 241 and the second pad 242.

The protective layer 243 is provided on the upper surface and lower surface of the base film 231 to protect the metal film forming the signal wirings 232, 233, 234 exposed to the outside. The protective layer 243 is formed over the entire upper surface and the lower surface of the COF 230, but it is removed from the mounted region of the data driving unit 245 in the upper part thereof and the formed region of the first pad 241 and the second pad 242 in the lower part, and the signal wiring 232, 233, and 234 and the pad 241, 242 are exposed to the outside, and the exposed input wiring 234 is connected with the PCB, and the exposed first output wiring 232 and the second output wiring 233 are connected with the display panel 210.

In this case, since the first through hole 235 is arranged in the region between the first pad 241 and the second pad 242, the protective layer 243 is not formed in the first pad 241, the through hole 235, and the second pad 242, and is exposed to the outside. However, when the first pad 241, the first through hole 235, and the second pad 242 are attached to the display panel 210, the conductive film 218 such as the anisotropic conductive film is provided, and thus, it is possible to protect it from the external environment even if there is no the protective layer 243.

Also in this embodiment, a signal supplied from the PCB is input to the data driving unit 245 through the input wiring 234. In addition, the first bump 246a of the data driving unit 245 passes through the first output wiring 232 and the display panel 210 is electrically connected to the pad 216, and the second bump 246b of the data driving unit 245 passes through the second output wiring 233 and the display panel is electrically connected to the pad 216, and the signal output from the data driving unit 245 is supplied to the display panel 210 through two signal paths P1, P2.

Figure 6:
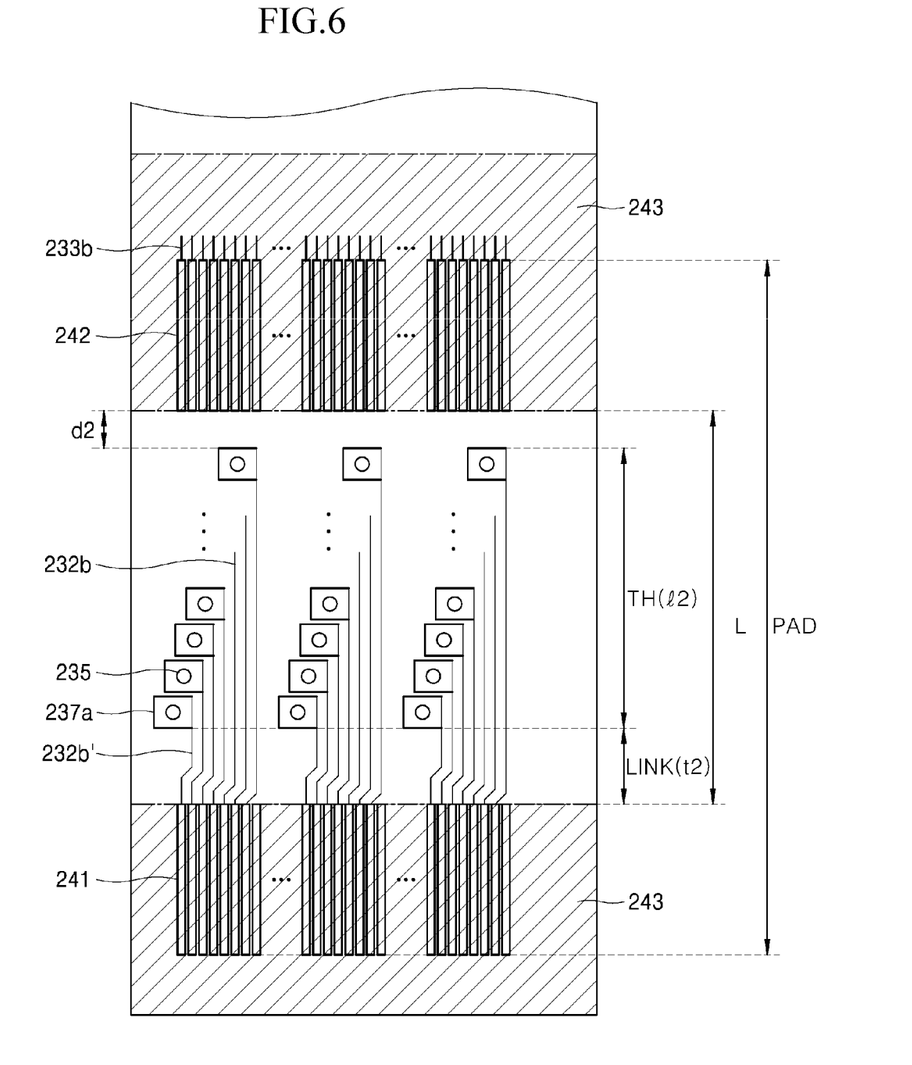
FIG. 6 is a partial rear view of a COF in accordance with a second embodiment of the present disclosure.

FIG. 6 is a partial rear view of the COF 230 in accordance with the second embodiment of the present disclosure, showing the first pad 241, the second pad 242, and the first through hole 235.

As shown in FIG. 6, the first pad 241 and the second pad 242 of the COF 230 are formed in a strip shape extending in the longitudinal direction, and a plurality of pads are arranged along the width direction in the lower surface of the COF 230. Each of the plurality of first pads 241 is connected to each of the plurality of first output wirings 232 in a one-to-one correspondence manner and each of the plurality of second pads 242 is connected to each of the plurality of second output wirings 233 in a one-to-one correspondence manner. In addition, each of the plurality of first output wirings 232 and the second output wirings 233 is connected to the output terminal of the data driving unit 245 in one-to-one.

The first pad 241 and the second pad 242 are arranged in the pad region (PAD), and in this case, the first pad 241 and the second pad 242 are spaced apart from each other by a predetermined distance L, and the spaced first pad 241 and second pad 242 are connected to the pad 216 of the display panel 210.

The first lower output wiring 232b is electrically connected to the first connection wiring 237 of the first through hole 235. In this case, a through hole pad 237a formed by extending an inner first connection wiring 237 is provided around each of the first through holes 235 on the rear surface of the COF 230, and the through hole pad 237a is connected to the first lower output wiring 232b and the first lower output wiring 232b is connected to the first connection wiring 237.

The plurality of through hole pads 237a are formed in the through hole region (TH) formed to have a length of l2, and the through hole region (TH) is arranged in the pad region (PAD). In this case, the through hole region (TH) is arranged with spaced apart from the second pad 242 by a distance of d2, and the through hole pad 241 connected with the first pad 241 through the first lower output wiring 232b is prevented from being connected to the second pad 242.

The through hole pad 237a is arranged to be spaced apart by a predetermined distance along the longitudinal direction of the COF 230 in the through hole region (TH) and to be overlapped with each other along the width direction so that it is spaced apart along the longitudinal direction between the adjacent through hole pads 237a to each other, and they are not shorted each other.

In addition, the first lower output wiring 232b extended from the first pad 241 to the first through hole 235 is bent in a predetermined angle in a link region (LNK) between the first pad 241 and the through hole 237a so that the link part connecting the first lower output wiring 232b and the through hole 237a, i.e., the link wiring 232b' is formed in a length of t2.

The protective layer 243 is laminated on the lower surface of the COF 230 to cover the first lower output wiring 232b and the second lower output wiring 233b. In this case, the protective layer 243 is removed from the pad region (PAD) including the first pad 241, the second pad 242, the through hole region (TH), and the link region (LINK), and the first pad 241 and the second pad 242 are exposed to the outside and come into contact with the pad 216 of the display panel 110.

As described above, in this embodiment as well, the COF 230 has the first output wiring 232 and the second output wiring 233 formed on the upper surface and lower surface thereof, and the signal is applied from the data driving unit 245 to the display panel 210 using two signal paths P1, P2. Therefore, compared with the structure in which the output wiring is provided on only one side of the COF 230 and the signal is applied, the output wiring can be provided twice in the COF 230, so that the width of the COF 230 can be greatly reduced. In addition, since the output wiring can be densely packed in the same region as the general structure, it can be suitably applied to a high resolution display device.

Also, in this embodiment, since the through hole region (TH) and the link region (LINK) are formed between the first pad 241 and the second pad 242, the length of the COF 230 can be reduced. It will be explained in the following.

Figure 7:
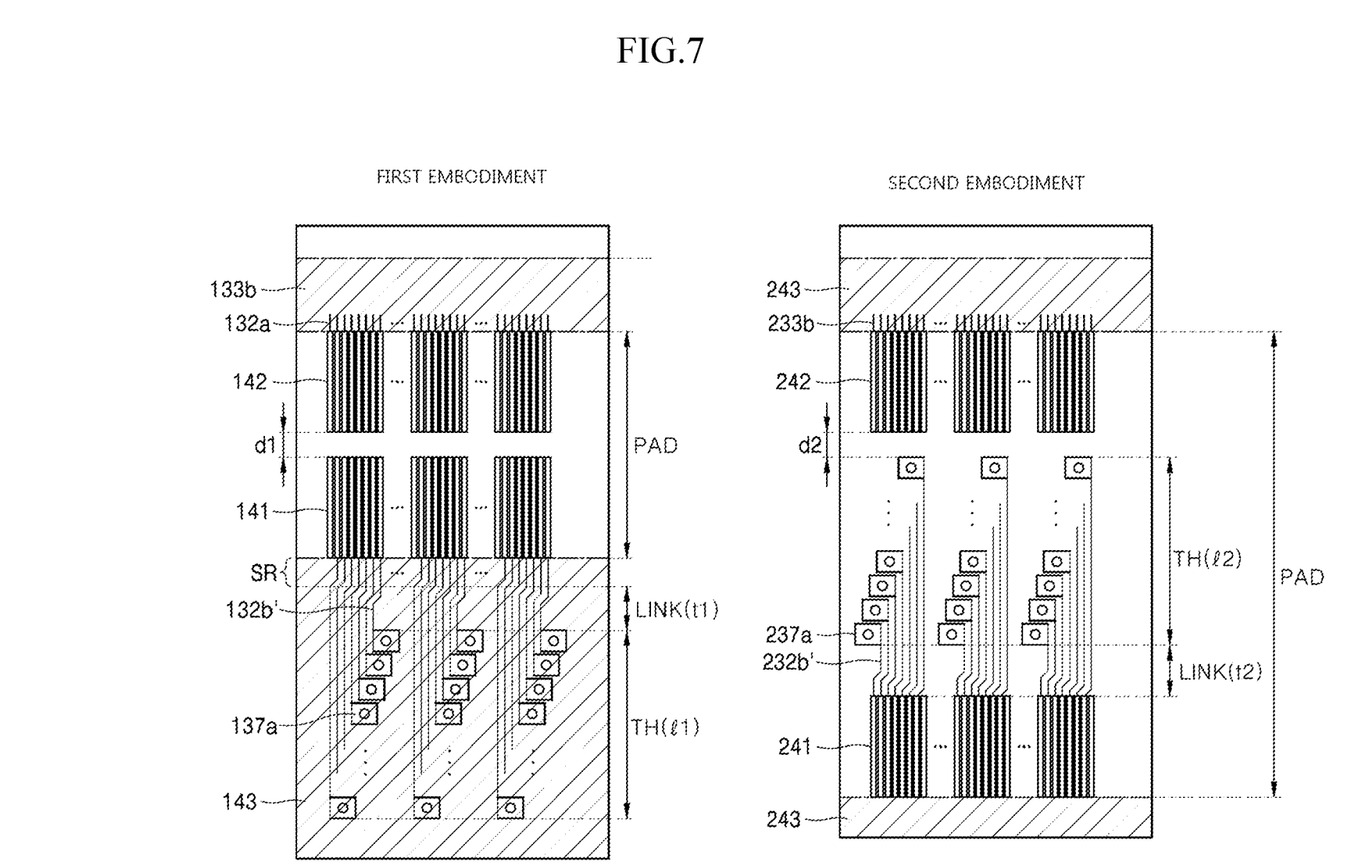
FIG. 7 is a cross-sectional view for explaining a difference in COF in accordance with the first embodiment and the second embodiment of the present disclosure.

FIG. 7 is a plan view showing the structure of the COF in accordance with the first embodiment and the second embodiment of the present disclosure.

As shown in FIG. 7, in the COF 130 in accordance with the first embodiment of the present disclosure, the lower surface is arranged in an order of the second pad 142, the first pad 141, the link wiring 132b', and the through hole pad 137a, and in the COF 230 in accordance with a second embodiment, it is arranged in an order of the second pad 242, the through hole pad 237a, the link wiring 232b', and the first pad 241.

Accordingly, the COF 130 of the first embodiment is composed in an order of the pad region (PA), the link region (LINK), and the through hole region (TH). In the COF 230 of the second embodiment, the through hole region (TH) and the link region (LINK) are arranged within the pad region (PA).

In this case, the lengths of the first pad 141 and the second pad. 142 of the COF 130 of the first embodiment are the same as the lengths of the first pad 241 and the second pad 242 of the COF 230 of the second embodiment. Distance d1 between the first pad 141 and the second pad 142 of the COF 130 of the first embodiment is equal to distance d2 between the through hole (TH) and the second pad 242 of the COF 130 of the first embodiment (d1=d2). In addition, length t1 of the link region (LINK) of the COF 130 of the first embodiment is equal to the length t2 of the link region (LINK) of the first embodiment is same as length t2 of the link region (LINK) of the COF 230 of the second embodiment (t1=t2). The length of the through hole region (TH) of the first embodiment is the same as the length of the through hole region (TH) of the second embodiment (l1=l2). Therefore, the COF 130 of the first embodiment of the present disclosure and the COF 230 of the second embodiment 230 are different from each other only in the arrangement positions of the first pad, the second pad, the link wiring, and the through hole, and their lengths are same.

Meanwhile, the protective layers 143, 243 are formed on the upper surface and the lower surface of the COFs 130 and 230 of the first and second embodiments to cover the signal wirings 132, 133, 134, 232, 233, 234, and the signal wirings 132, 133, 134, 232, 233, 234 are exposed to the outside, and it prevents the defect from being generated by a corrosion, etc. In addition, the protective layer is not formed in the pad region (PAD), and the exposed pads 141, 142, 241, 242 electrically connect with the pads 116, 216 of the display panel.

In the COF 130 of the first embodiment, since the protective layer 143 is formed over the entire lower surface except the pad region (PAD), the link wiring 132b' and the through hole pad arranged outside the pad region (PAD) are covered.

Meanwhile, the protective layer 143 is formed of the solder resist. The solder resist is applied to the upper surface and the lower surface of the COF 130 and formed by an exposure process using a mask and the solder resist in the pad region (PAD) is also removed by the exposure process to expose the first pad 141 and the second pad 142 to the outside.

A process tolerance occurs in the exposure process for forming the protective layer 143. Accordingly, in order to expose the pad region (PAD) by the exposure process, the extra tolerance region, in which the protective layer 143 is formed in the outside regions of the pad region (PAD), that is, a region between the first pad 141 and the first lower output wiring 132b, and a region between the second pad 142 and the second lower output wiring 133b, has to be added.

Therefore, in the structure in the first embodiment shown in FIG. 7, the tolerance region (SR) is formed between the first pad 141 and the link wiring 132b' and forms the first lower output wiring 132b extended from the link wiring 132b' in the tolerance region (SR).

On the other hand, in the second embodiment, since the protection layer 243 is formed all over the lower surface except the pad region (PAD), the link wiring 232b' and the through hole pad 237a disposed in the pad region (PAD) are not covered and are exposed to the outside. In other words, in the lower surface of the COF 230 of the second embodiment, the protective layer 243 is formed in a region from the first pad 241 to one end of the COF 230 and a region from the second pad 242 to the other end of the COF 230, which is an outside region of the pad region (PAD).

In this case, also in the second embodiment, the extra tolerance region (SR) is formed in the outside region of the pad region (PAD), i.e., the region from the first pad 241 to the one side end of the COF 230.

However, in the case of the second embodiment, since the link wiring 231b' and the through hole pad 237a are formed in the pad region (PAD), in the region in which the link wiring 231b' and the through hole pad 237a are formed, the tolerance region (SR) is not generated and the tolerance region (SR) is generated only in the outside region of the pad region (PAD).

In other words, in the COF 230 according to the second embodiment of the present disclosure, the tolerance region SR is not formed between the first pad 241 and the second pad 242, and is formed between the first pad 241 and one side end of the COF 203.

Meanwhile, the COF 230 forms the metal layer and the protective layer on the upper surface and the lower surface of a roll-shaped base film having a predetermined width by a photo process, and the film formed with the plurality of units COF along the longitudinal direction is manufactured, and then, the manufactured film is cut by the determined length, thereby separating the unit COF 230. Since the tolerance always occurs at the time of cutting the film, the film is cut in consideration of the cutting tolerance.

One side and the other side ends in the longitudinal direction of the COF 230 shown in FIG. 7 are the regions in which the roll-shaped film is cut, and the cut regions are formed in consideration of the cutting tolerance of the film. In the COF 230 according to the second embodiment of the present disclosure, the tolerance region SR and the cutting tolerance region are formed between the pad region (PAD) and the end of the film. Therefore, in the COF 230 according to the second embodiment of the present disclosure, the cutting tolerance region corresponding to the tolerance region SR can be reduced, so that the tolerance region is absorbed (or canceled) by the cutting tolerance region, and the length of the film is not increased by the tolerance region.

Therefore, comparing the COF 130 according to the first embodiment of the present disclosure and the COF 230 according to the second embodiment, since the tolerance region SR is not required in the COF 230 of the second embodiment, the length of the COF 230 of the second embodiment can be reduced by the tolerance region SR compared with the COF 130 of the first embodiment.

In other words, the COF 230 according to the second embodiment of the present disclosure can reduce the width of the COF 230 by forming the output wirings 232, 233 on the upper surface and the lower surface, and the length of the CF 230 can be reduced by arranging the link wiring 232b' and the first through hole 235 between the first pad 241 and the second pad 242, and thus, the area of the COF 230 can be greatly reduced.

In addition, in the COF 230 according to the second embodiment of the present disclosure, since the length from the end of the COF 230 attached to the display panel 210 to the second pad 242 is reduced by the tolerance region (SR) compared to the COF 130 of the first embodiment, the area the attached region of the display panel to which the COF 230 is attached is reduced, thereby reducing a bezel of the display device.

Also, the chip on film and display device of the present disclosure can be applied to a mobile device, a video phone, a smart watch, a watch phone, a wearable device, a foldable device, a rollable device, a bendable device, a flexible device, a curved device, an electronic notebook, an electronic book, a portable multimedia player (PMP), a personal digital assistant (PDA), a MP3 player, a mobile medical device, a desktop PC, a laptop PC, a netbook computer, a workstation, a navigation, a navigation for vehicle, a display device for vehicle, a television, a wall paper display device, a notebook, a monitor, a camera, a camcorder, a home appliance, etc.

The present disclosure can be described as follows.

The chip on film according to an embodiment of the present disclosure includes the base film, the signal wiring arranged on the upper surface and the lower surface of the base film to transmit the signals in two signal paths, the driving unit mounted on one surface of the upper surface and the lower surface of the base film, and the first pad and the second pad provided one surface of the upper surface and the lower surface of the base film, and the plurality of through holes which are provided between the first pad and the second pad and electrically connect the signal wiring.

According to another characteristic of the present disclosure, the chip on film can further include the connection wiring provided inside the plurality of through holes and the plurality of through hole pads which are disposed in one surface of the upper surface and the lower surface of the base film and formed in the periphery of the plurality of through holes and connected to the connection wiring.

According to another characteristic of the present disclosure, the plurality of through hole pads may be arranged such that it is spaced apart along the longitudinal direction of the base film and is overlapped along the width direction.

According to another characteristic of the present disclosure, the link wiring arranged between the through hole pad and the signal wiring can be further included.

According to another characteristic of the present disclosure, the protective layer provided in the upper surface and the lower surface of the base film except the region between the first pad and the second pad can be further included.

According to another characteristic of the present disclosure, the protective layer may be composed of a solder resist (SR).

According to another characteristic of the present disclosure, the tolerance region for forming a protective layer may be formed in the outer region of the region between the first pad and the second pad, and the tolerance region may be canceled by the cutting tolerance region of the base film.

According to another characteristic of the present disclosure, the driving unit may be a semiconductor IC chip.

The display device according to the embodiment of the present disclosure may be composed by a display region displaying the image, the display panel including the pad region outside the display region, and the chip on film attached to the pad region.

According to another characteristic of the present disclosure, the pad region may further include a pad connected to the first pad and the second pad of the chip on film.

According to another characteristic of the present disclosure, the display panel may be the liquid crystal display panel, the organic light emitting display panel, or the electro phoretic display panel.

While many matters are described specifically in the above mentioned description, it is to be constructed that it is an example of the preferred embodiments rather than liming the scope of the disclosure. Therefore, the disclosure is not defined by the explained embodiments and has to be defined by claims and equivalents to claims.

What is claimed is:
1. A chip on film, comprising:
a base film;
a plurality of signal wirings on an upper surface and a lower surface of the base film to transmit a signal through two signal paths;
a driving unit on one surface of the upper surface or the lower surface of the base film;
a first pad and a second pad on one surface of the upper surface or the lower surface of the base film; and
a plurality of through holes between the first pad and the second pad to electrically connect the signal wirings.
2. The chip on film of claim 1, further comprising:
a connection wiring inside each of the through holes; and
a plurality of through hole pads on one surface of the upper surface and the lower surface of the base film, and disposed at a periphery of the plurality of through holes to be connected to the connection wiring.
3. The chip on film of claim 2, wherein the plurality of through hole pads are arranged to be spaced along a longitudinal direction of the base film and to be overlapped along a width direction.
4. The chip on film of claim 3, further comprising a link wiring between the through hole pad and the signal wiring.
5. The chip on film of claim 4, further comprising a protective layer on the upper surface and the lower surface of the base film except a region between the first pad and the second pad.
6. The chip on film of claim 5, wherein the protective layer comprises a solder resist (SR).
7. The chip on film of claim 5, wherein a tolerance region for forming the protective layer is formed in the outside a region between the first pad and the second pad and the tolerance region is canceled by a cutting tolerance region of the base film.
8. The chip on film of claim 1, wherein the driving unit is a semiconductor integrated Circuit (IC) chip.
9. A display device comprising:
a display panel including a display region and a pad region outside the display region; and
a chip on film attached to the pad region, the chip on film comprising:
a base film,
a plurality of signal wirings on an upper surface and a lower surface of the base film to transmit a signal through two signal paths,
a driving unit on one surface of the upper surface or the lower surface of the base film,
a first pad and a second pad on one surface of the upper surface or the lower surface of the base film, and
a plurality of through holes between the first pad and the second pad to electrically connect the signal wirings.
10. The display device of claim 9, further comprising a plurality of pads in the pad region of the display panel, the pads being connected to a first pad and a second pad of the chip on film.
11. The display device of claim 9, wherein the display panel is a liquid crystal display panel, an organic light emitting display panel, or an electro phoretic display panel.

* * * * *